United States Patent
Chen et al.

(10) Patent No.: US 9,472,524 B2
(45) Date of Patent: *Oct. 18, 2016

(54) COPPER-CONTAINING LAYER ON UNDER-BUMP METALLIZATION LAYER

(71) Applicant: TAIWAN SEMICONDUCTOR MANUFACTURING COMPANY, LTD., Hsinchu (TW)

(72) Inventors: Yu-Feng Chen, Hsinchu (TW); Chun-Hung Lin, Taipei (TW); Han-Ping Pu, Taichung (TW); Chih-Hang Tung, Hsinchu (TW); Kai-Chiang Wu, Hsinchu (TW); Ming-Che Ho, Tainan (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/863,942

(22) Filed: Sep. 24, 2015

(65) Prior Publication Data

US 2016/0020186 A1 Jan. 21, 2016

Related U.S. Application Data

(63) Continuation of application No. 13/443,556, filed on Apr. 10, 2012, now Pat. No. 9,159,686.

(60) Provisional application No. 61/590,261, filed on Jan. 24, 2012.

(51) Int. Cl.
*H01L 23/488* (2006.01)
*H01L 23/00* (2006.01)

(52) U.S. Cl.
CPC ............... *H01L 24/13* (2013.01); *H01L 24/05* (2013.01); *H01L 23/488* (2013.01); *H01L 24/02* (2013.01);

(Continued)

(58) Field of Classification Search
CPC ..... H01L 23/488; H01L 24/02; H01L 24/10; H01L 24/11; H01L 24/16; H01L 24/13; H01L 2224/0401; H01L 2224/05027; H01L 2224/05111; H01L 2224/05144; H01L 2224/05147; H01L 2224/05155; H01L 2224/05166; H01L 2224/05181; H01L 2224/05186

See application file for complete search history.

(56) References Cited

U.S. PATENT DOCUMENTS 5,640,052 A 6/1997 Tsukamoto
6,077,726 A 6/2000 Mistry et al.

(Continued)

FOREIGN PATENT DOCUMENTS

KR 10-0153212 12/1998
KR 10-0509318 8/2005

(Continued)

OTHER PUBLICATIONS

Office Action dated Jan. 26, 2015 from corresponding No. TW 101147091.

(Continued)

*Primary Examiner* — David Zarneke
(74) *Attorney, Agent, or Firm* — Eschweiler & Associates, LLC

(57) ABSTRACT

A semiconductor device includes an under-bump metallization (UBM) layer over a substrate. The semiconductor device also includes a copper-containing layer having a base portion over the UBM layer. The semiconductor device further includes a solder bump over the UBM layer and over the copper-containing layer. The base portion is embedded in the solder bump. The copper-containing layer has a cylindrical shape and includes at least two segments separated by at least two openings. A first total area (A) of the at least two openings is greater than about 3% of a second total area (B) of the at least two segments. The first total area (A) is less than about 70% of the second total area (B) of the at least two segments.

20 Claims, 4 Drawing Sheets

(52) U.S. Cl.
CPC ........... *H01L 24/10* (2013.01); *H01L 24/11* (2013.01); *H01L 24/16* (2013.01); *H01L 2224/0401* (2013.01); *H01L 2224/05027* (2013.01); *H01L 2224/05111* (2013.01); *H01L 2224/05144* (2013.01); *H01L 2224/05147* (2013.01); *H01L 2224/05155* (2013.01); *H01L 2224/05166* (2013.01); *H01L 2224/05181* (2013.01); *H01L 2224/05186* (2013.01); *H01L 2224/05551* (2013.01); *H01L 2224/05555* (2013.01); *H01L 2224/05572* (2013.01); *H01L 2224/05611* (2013.01); *H01L 2224/05644* (2013.01); *H01L 2224/05647* (2013.01); *H01L 2224/05655* (2013.01); *H01L 2224/05666* (2013.01); *H01L 2224/05681* (2013.01); *H01L 2224/05686* (2013.01); *H01L 2224/10125* (2013.01); *H01L 2224/1146* (2013.01); *H01L 2224/1147* (2013.01); *H01L 2224/11849* (2013.01); *H01L 2224/13012* (2013.01); *H01L 2224/13076* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/16237* (2013.01); *H01L 2224/16238* (2013.01); *H01L 2224/81191* (2013.01); *H01L 2924/00014* (2013.01); *H01L 2924/01029* (2013.01); *H01L 2924/12042* (2013.01)

(56) References Cited

U.S. PATENT DOCUMENTS

| 7,015,590 | B2 | 3/2006 | Jeong et al. |
| 7,928,583 | B2 | 4/2011 | Okumura et al. |
| 8,446,008 | B2 | 5/2013 | Kasai et al. |
| 2004/0134974 | A1 | 7/2004 | Oh et al. |
| 2004/0197979 | A1 | 10/2004 | Jeong et al. |
| 2006/0113681 | A1 | 6/2006 | Jeong et al. |
| 2007/0132097 | A1 | 6/2007 | Wark et al. |

FOREIGN PATENT DOCUMENTS

| KR | 10-2006-0034716 | 4/2006 |
| TW | 200719417 | 5/2007 |
| TW | 200719420 | 5/2007 |
| TW | 201128750 | 8/2011 |
| WO | 2005013339 | 2/2005 |

OTHER PUBLICATIONS

Office Action dated Nov. 20, 2013 and English translation from corresponding application No. KR 10-2012-0111208.

US 9,472,524 B2

COPPER-CONTAINING LAYER ON UNDER-BUMP METALLIZATION LAYER

PRIORITY CLAIM

The present application is a continuation of U.S. application Ser. No. 13/443,556, filed Apr. 10, 2012, which claims priority of U.S. Provisional Application No. 61/590,261, filed Jan. 24, 2012, which are incorporated herein by reference in their entirety.

BACKGROUND

Generally, a semiconductor die may be bonded to another substrate, such as an organic printed circuit board, using such technologies as ball grid arrays or controlled collapse chip connection (C4) solder bumps. In one such process, a solder bump may be formed on either the semiconductor die or the substrate or on both using methods such as plating, paste screening or ball mount and then reflowing the solder into a desired bump shape. Once the solder bump has been formed, the contacts on the semiconductor die are aligned with their corresponding contacts on the substrate, with the solder bump located between the contacts. Once aligned, the solder bump is again reflowed and liquefied, wherein the liquefied solder flows and wets onto the contact pads, providing an electrical and physical connection between the semiconductor die and the substrate.

However, a semiconductor die may have a much different coefficient of thermal expansion than the substrate. As such, when the semiconductor die is bonded to the substrate and they are both going through the thermo-mechanical cycling which may be used to simulate the system power on and off cycles to meet the JEDEC reliability test requirements, the semiconductor die and the substrate will expand during heating up cycles and contract during cooling down cycles to different lengths. Such an expansion causes stresses to form at the solder joints interconnecting the semiconductor die and the substrate. This problem is especially prevalent at connections between the semiconductor die and the substrate. In particular, the stresses caused by the mismatch of coefficients of thermal expansion between the semiconductor die and the substrate are so intense that cracks may actually develop in the solder joints interconnecting the semiconductor die and the substrates. These cracks could then propagate through the whole joint and degrade or even destroy the electrical continuity and/or physical connections between the semiconductor die and the substrates. Such destruction may render the parts useless and require a complete refabrication.

BRIEF DESCRIPTION OF THE DRAWINGS

For a more complete understanding of embodiments of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a crack stopper for a solder joint between a semiconductor die and a substrate in a wafer level chip scale package, C4 or package-on-package (PoP) interconnect structures. The embodiments may also be applied, however, to other bonding processes.

Figure 1:
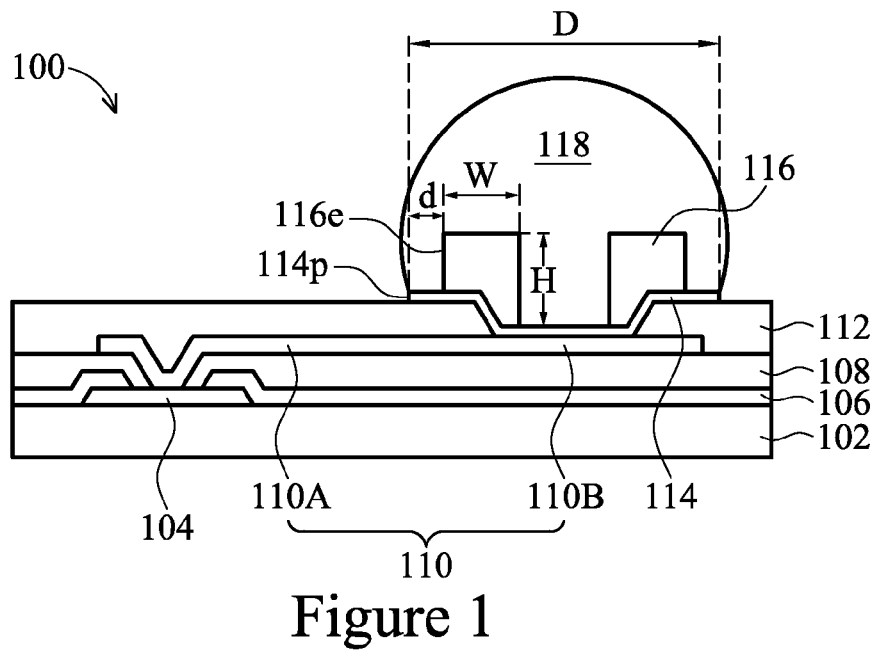
FIG. 1 is a cross-sectional view illustrating a crack stopper located on a semiconductor die in accordance with an embodiment.

With reference now to FIG. 1, there is shown a semiconductor die 100 with a semiconductor base substrate 102, a contact pad 104, a passivation layer 106, a first protective layer 108, a post-passivation interconnect (PPI) layer 110, a second protective layer 112, an under-bump metallization (UBM) layer 114, a crack stopper 116 and a bump 118.

The semiconductor base substrate 102 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Various active devices and/or passive devices may be formed either within or else on the semiconductor base substrate 102. An interconnection structure including metallization layers and inter-metal-dielectric (IMD) layers can be formed on the semiconductor base substrate 102 to connect the various active devices and/or passive devices, resulting in functional circuitry.

The contact pad 104 is formed on the upper-most dielectric layer and connected the upper-most metallization layer of the interconnect structure. The contact pad 104 may comprise aluminum, but other materials, such as copper, may alternatively be used. The passivation layer 106 is formed on the semiconductor base substrate 102 over the interconnection structure and then patterned with an opening to expose a portion of the contact pad 104. The passivation layer 106 may be made of one or more suitable dielectric materials such as silicon oxide, silicon nitride, low-k dielectrics such as carbon doped oxides, extremely low-k dielectrics such as porous carbon doped silicon dioxide, combinations of these, or the like.

The first protective layer 108 is formed on the passivation layer 106 and patterned with another opening to expose a portion of the contact pad 104. The opening through the first protective layer 108 allows for electrical contact between the contact pad 104 and PPI layers 110. The first protective layer 106 may be made of one or one more suitable polymer materials such as epoxy, polyimide, benzocyclobutene (BCB), polybenzoxazole (PBO), and the like, although other relatively soft, often organic, dielectric materials can also be used. Alternatively, the first protective layer 108 may be formed of a material similar to the material used as the passivation layer 106, such as silicon oxides, silicon nitrides, low-k dielectrics, extremely low-k dielectrics, combinations of these, and the like.

The PPI layer 110 is a patterned metallization layer on the first protective layer 108 and electrically connected to the contact pad 104 through the opening in the first protective layer 108. In some embodiments, the PPI layer 110 includes at least one of a copper (Cu) layer, an aluminum (Al) layer, a copper alloy layer, a nickel layer, a gold layer, or other mobile conductive materials. In one embodiment, the PPI layer 110 includes a dielectric layer on the metallization layer, such as a silicon nitride layer, an oxide layer or the like. In some embodiments, the PPI layer 110 functions as power lines, re-distribution lines (RDL), inductors, capacitors or any passive components. In an embodiment, the PPI layer 110 includes an interconnect line region 110A and a landing pad region 110B, and a bump feature will be formed over and electrically connected to the landing pad region 110B in subsequent processes. In an embodiment, the landing region 110B is not directly over the contact pad 104 as depicted in FIG. 1. In other embodiments, the landing pad region 110B is directly over the contact pad 104.

The second protective layer 112 is formed on PPI layer 110 and the exposed surface of the first protective layer 108. The second protective layer 112 is patterned to form a window to expose a portion of the landing pad region 110B of the PPI layer 110. The second protective layer 112 may be made of one or one more suitable polymer materials such as epoxy, polyimide, benzocyclobutene (BCB), polybenzoxazole (PBO), and the like, although other relatively soft, often organic, dielectric materials can also be used. In some embodiments, the second protective layer 112 is formed of a material similar to or the same as the material used as the first protective layer 108.

The UBM layer 114 is formed on the exposed portion of the landing pad region 110B. In an embodiment, the UBM layer 114 is formed along the bottom and sidewalls of the window in the second protective layer 112 and extends to the surface of the second protective layer 112 to a predetermined distance. In an embodiment the UBM layer 114 includes at least one conductive layer formed of titanium, titanium, titanium copper, nickel or alloys thereof. Any suitable conductive materials or combination of different layers of material that may be used for the UBM layer 114 are intended to be included within the scope of the current application. The UBM layer 114 may be created by forming each layer over the second protective layer 112 and the window of the second protective layer 112. The forming of the UBM layer 114 may be performed using a plating process, such as electrochemical plating, although other processes of formation, such as sputtering, evaporation, or PECVD process, may alternatively be used depending upon the desired materials. Once the desired layers have been formed, portions of the UBM layer 114 may then be removed through a suitable photolithographic masking and etching process to remove the undesired material and to leave the UBM layer 114 in a desired shape, such as a circular, octagonal, square, or rectangular shape, although any desired shape may alternatively be formed.

The crack stopper 116 may be formed over and in physical contact with the UBM layer 114. In some embodiments, the crack stopper 116 is formed using a masking and plating process in the shapes described with respect to FIGS. 1-3. The crack stopper 116 may be formed from a conductive material such as copper, although other conductive materials such as nickel, gold, or metal alloys, the like or a combination of them constructed in separate layers may also be used.

The crack stopper 116 may be placed and shaped in such a fashion as to extend from the UBM layer 114 and, eventually, into the bump 118. Additionally, the crack stopper 116 may be placed and shaped in such a fashion as to intercept and stop any cracks that may originate from the edge of the UBM layer 114 and/or PPI layer 110 and prevent the cracks from spreading further into the interior of the UBM layer 114 and/or PPI layer 110.

Figure 2:
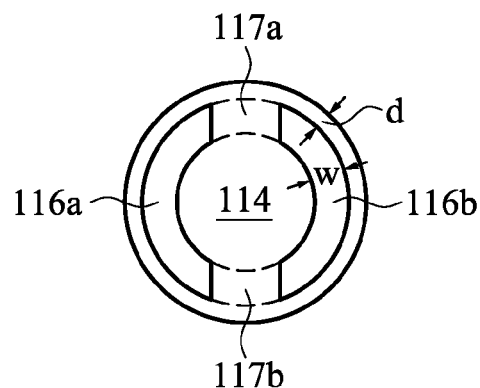
FIG. 2 is a top view illustrating a crack stopper having openings in accordance with an embodiment.

FIG. 2 illustrates one such placement and shape of the crack stopper 116, in which FIG. 2 is a top-down (plan) view of the crack stopper 116 and the UBM layer 114. In this embodiment the crack stopper 116 may be placed near the outside periphery 114$p$ of the UBM layer 114 and may be shaped in a hollow cylinder e.g., a ring shape, whose outside edge 116$e$ runs close to the outside periphery 114$p$ of the UBM layer 114. In an embodiment, the diameter (D) of the UBM layer 114 and a distance (d) between the outside edge of the crack stopper 116 and the outside periphery of the UBM layer 114 satisfy the formula: $\frac{1}{3}*D>3$ μm. For example, D=240 μm and 80 μm>d>3 μm. The crack stopper 116 has a wall thickness W and a wall height H. In at least one embodiment, the ratio of height to thickness (H/W) is as follows: H/W≥1 or H/W≥2. In some embodiments, the thickness (W) is less than about 20 μm, for example about 15 μm. In some embodiments, the height (H) is greater than 15 μm, or greater than 20 μm, for example, the height is about 30 μm. In addition, the crack stopper 116 may have at least two openings 117$a$ and 117$b$ so as to separate the crack stopper 116 into two segments 116$a$ and 116$b$. In an embodiment, the two openings 117$a$ and 117$b$ together have a total opening area A in plan view (i.e., as seen in a thickness direction of the substrate 102), and the two segments 116$a$ and 116$b$ together have a total crack stopper area B in plan view. The areas A and B satisfy the formula: 0.7*B>A>0.03*B.

Figure 3:
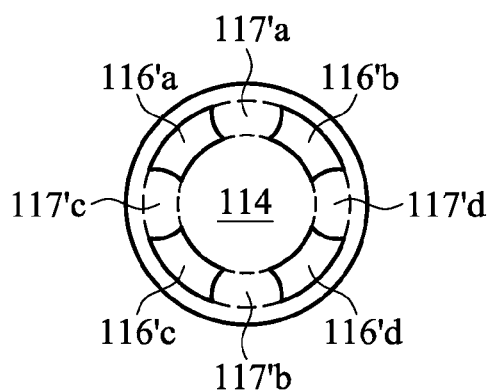
FIG. 3 is a top view illustrating a crack stopper having openings in accordance with another embodiment.

FIG. 3 is a top-down (plan) view of the crack stopper 116 and the UBM layer 114 according to another embodiment. In this embodiment, the crack stopper 116 may be placed near the outside periphery 114$p$ of the UBM layer 114 and may be shaped in a ring shape, such as a hollow cylinder whose outside edge 116$e$ runs close to the outside periphery of the UBM layer 114 with a distance (d) in between. In an embodiment, the diameter (D) and the distance (d) satisfy the formula: $\frac{1}{3}*D>3$ μm. In this embodiment, the crack stopper 116 has four openings 117'$a$, 117'$b$, 117'$c$ and 117'$d$ so as to separate the crack stopper 116 into four segments 116'$a$, 116'$b$, 116'$c$ and 116'$d$. In an embodiment, the four openings 117'$a$, 117'$b$, 117'$c$ and 117'$d$ together have a total opening area A in plan view, and the four segments 116'$a$, 116'$b$, 116'$c$ and 116'$d$ together have a total crack stopper area B in plan view. The areas A and B satisfy the formula: 0.7*B>A>0.03*B.

By forming the crack stopper 116 as a hollow cylinder) with openings 117 around the outside periphery 114$p$ of the UBM layer 114, cracks that may develop along the outside of the UBM layer 114 and/or PPI layer 110 and propagate inwards will encounter the crack stopper 116 perpendicularly. Such a perpendicular interaction will help prevent the crack from propagating any further into the UBM layer 114 and/or PPI layer 110. In this fashion, the crack stopper 116 can prevent cracks from degrading the performance of the semiconductor die 100. The openings 117 in the hollow cylinder may provide a measure of stress relief. For example, during thermal cycling, when the material of the hollow cylinder is expanding, the openings 117 allow the hollow cylinder to expand without pushing against another part of the hollow cylinder. As such, damage from the stresses caused by this expansion mismatch during the thermo-mechanical cycling may be reduced.

However, as one of ordinary skill in the art will recognize, the above described ring shapes and/or hollow cylinders are intended to be illustrative examples only and are not intended to limit the hollow cylinder. Other shapes that maintain the hollow cylinder but that are not perfectly circle are also fully intended to be included in some embodiments. For example, the outside edge 116e of the crack stopper 116 may be shaped as an octagon, pentagon, hexagon, and the like, while still maintaining the overall ring shape. The inside edge of the crack stopper 116, in some embodiments, has a different shape from that of the outside edge of the crack stopper 116.

Returning now to FIG. 1, after the crack stopper 116 has been formed, the bump 118 is formed on the UBM Layer 114 to cover the crack stopper 116. In one embodiment, the bump 118 is a solder bump formed by attaching a solder ball on the UBM layer 114 and then thermally reflowing the solder material. In some embodiments, the solder bump may include a lead-free pre-solder layer, SnAg, or a solder material including alloys of tin, lead, silver, copper, nickel, bismuth, or combinations thereof. In some embodiments, the solder bump may be formed by plating a solder layer with photolithography technologies followed by reflowing processes. In some embodiments, the bump 118 has a diameter of about 200 μm to about 300 μm. In other embodiments, the bump 118 has a diameter of about 100 μm to about 200 μm. In still other embodiments, the bump 118 has a diameter of less than about 100 μm. By placing the crack stopper 116 on the UBM layer 114, the crack stopper 116 may prevent the propagation of cracks that may form within the bump 118. The crack stopper can provide better solder wetting solder jointing results, and prevent voids inside the solder joint structure as well.

FIGS. 4-9 illustrate various intermediate stages of a method of forming a crack stopper on a semiconductor die in accordance with an embodiment shown in FIG. 1.

Figure 4:
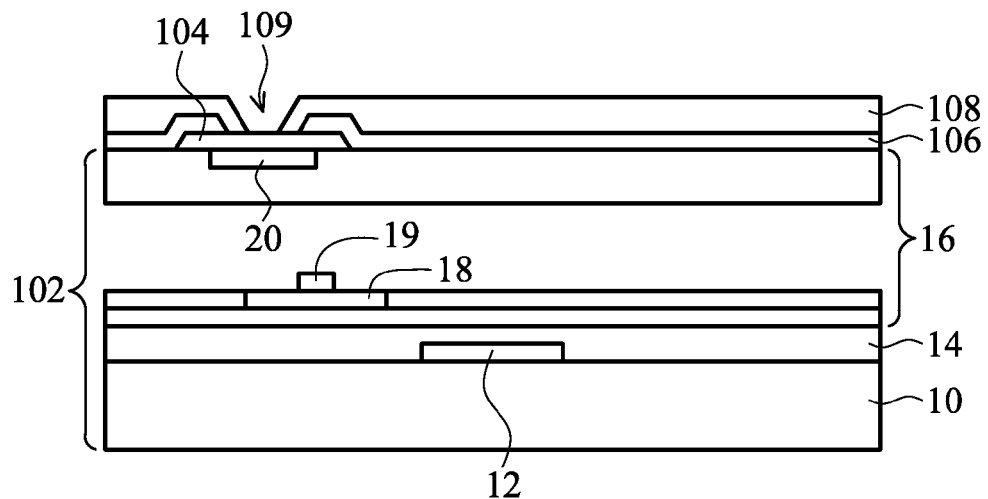
FIGS. 4-9 are cross-sectional views illustrating a method of forming a crack stopper on a semiconductor substrate in accordance with an embodiment.

Referring first to FIG. 4, the semiconductor substrate 102 includes a substrate 10, an electrical circuitry 12, an inter-layer dielectric (ILD) layer 14, inter-metal dielectric (IMD) layers 16 and the associated metallization layers.

A portion of the substrate 10 having electrical circuitry formed thereon is shown, in accordance with an embodiment. The substrate 10 may comprise, for example, bulk silicon, doped or undoped, or an active layer of a semiconductor-on-insulator (SOI) substrate. The substrate 10 may be provided as a wafer level scale or a chip level scale. Other substrates, such as a multi-layered or gradient substrate may also be used.

Electrical circuitry 12 formed on the substrate 10 may be any type of circuitry suitable for a particular application. In an embodiment, the electrical circuitry 12 includes electrical devices formed on the substrate 10 with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The ILD layer 14 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, the ILD layer 14 may comprise a plurality of dielectric layers. Contacts (not shown) may be formed through the ILD layer 14 to provide an electrical contact to the electrical circuitry 12.

One or more inter-metal dielectric (IMD) layers 16 and the associated metallization layers are formed over the ILD layer 14. Generally, the one or more IMD layers 16 and the associated metallization layers (such as metal lines 18 and vias 19) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. In some embodiments, one or more etch stop layers (not shown) may be positioned between adjacent ones of the dielectric layers, e.g., the ILD layer 14 and the IMD layers 16. Generally, the etch stop layers provide a mechanism to stop an etching process when forming vias and/or contacts. The etch stop layers are formed of a dielectric material having a different etch selectivity from adjacent layers, e.g., the underlying semiconductor substrate 10, the overlying ILD layer 14, and the overlying IMD layers 16. In an embodiment, etch stop layers may be formed of SiN, SiCN, SiCO, CN, combinations thereof, or the like, deposited by CVD or PECVD techniques.

In some embodiments, the metallization layers including metal lines 18 and vias 19 may be formed of copper or copper alloys, or of other metals. Further, the metallization layers include a top metal layer 20 formed and patterned in or on the uppermost IMD layer to provide external electrical connections and to protect the underlying layers from various environmental contaminants. In some embodiments, the uppermost IMD layer may be formed of a dielectric material, such as silicon nitride, silicon oxide, undoped silicon glass, and the like. In subsequent drawings, semiconductor substrate 10, electrical circuitry 12, ILD layer 14, and metallization layers 18 and 19 are not illustrated. In some embodiments, the top metal layer 20 is formed as a part of the top metallization layer on the uppermost IMD layer.

Thereafter, the contact pad 104 is formed and patterned to contact the top metal layer 20, or alternatively, electrically coupled to top metal layer 20 through a via. In some embodiments, the contact pad 104 may be formed of aluminum, aluminum copper, aluminum alloys, copper, copper alloys, or the like. One or more passivation layers, such as a passivation layer 106 are formed and patterned over the contact pads 104. In some embodiments, the passivation layer 106 may be formed of a dielectric material, such as undoped silicate glass (USG), silicon nitride, silicon oxide, silicon oxynitride or a non-porous material by any suitable method, such as CVD, PVD, or the like. The passivation layer 106 is formed to cover the peripheral portion of the contact pad 104, and to expose the central portion of contact pad 104 through the opening in passivation layer 106. The passivation layer 106 may be a single layer or a laminated layer. In FIG. 4, a single layer of contact pad and a passivation layer are shown for illustrative purposes only. As such, other embodiments may include any number of conductive layers and/or passivation layers.

Next, a first protective layer 108 is formed and patterned over the passivation layer 106. In some embodiments, the first protective layer 108 may be, for example, a polymer layer, which is patterned to form an opening 109, through which the contact pad 104 is exposed. In some embodiments, the polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods. The first protective layer 108 has a thickness in a range between about 1 μm and about 10 μm. For example, a thickness between about 5 μm and about 8 μm.

Figure 5:
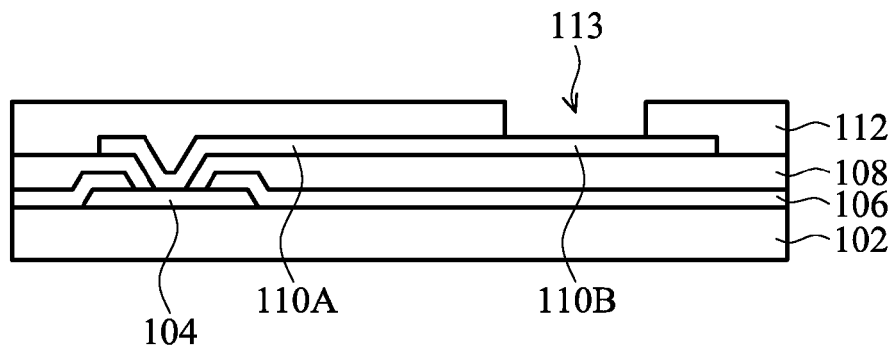

Referring to FIG. 5 at least one metallization layer 110 is formed on the first protective layer 108 and fills the opening 109 and then patterned as an interconnect layer 110, which is electrically connected to the contact pad 104 and may expose a portion of the underlying first protective layer 108. In at least an embodiment, the interconnect layer 110 is a post-passivation interconnect (PPI) layer 110, which may also function as power lines, re-distribution lines (RDL), inductors, capacitors or any passive components. The PPI layer 110 includes an interconnect line region 110A and a landing pad region 110B. In some embodiments, the interconnect line region 110A and the landing pad region 110B may be formed simultaneously, and may be formed of a same conductive material. A bump feature will be formed over and electrically connected to the landing pad region 110B in subsequent processes. In some embodiments, the PPI layer 110 may include copper, aluminum, copper alloy, or other mobile conductive materials using plating, electroless plating, sputtering, chemical vapor deposition methods, and the like. In one embodiment, the PPI layer 110 includes a copper layer or a copper alloy layer. In the embodiment of FIG. 5, the landing region 110B is not directly over the contact pad 104. In other embodiments, through the routing of PPI layer 110, the landing pad region 110B is directly over the contact pad 104.

With reference to FIG. 5, a second protective layer 112 is then formed on the substrate 10 to cover the PPI layer 110. Using photolithography and/or etching processes, the second protective layer 112 is further patterned to form an opening 113 exposing at least a portion of the landing pad region 110B of the PPI layer 110. The formation methods of the opening 113 may include lithography, wet or dry etching, laser drill, and/or the like. In some embodiments, the second protective layer 112 is formed of a polymer layer, such as an epoxy, polyimide, benzocyclobutene (BCB), polybenzoxazole (PBO), and the like, although other relatively soft, often organic, dielectric materials may also be used. In some embodiments, the second protective layer 112 is formed of a non-organic material selected from un-doped silicate glass (USG), silicon nitride, silicon oxynitride, silicon oxide, and combinations thereof.

Figure 6:
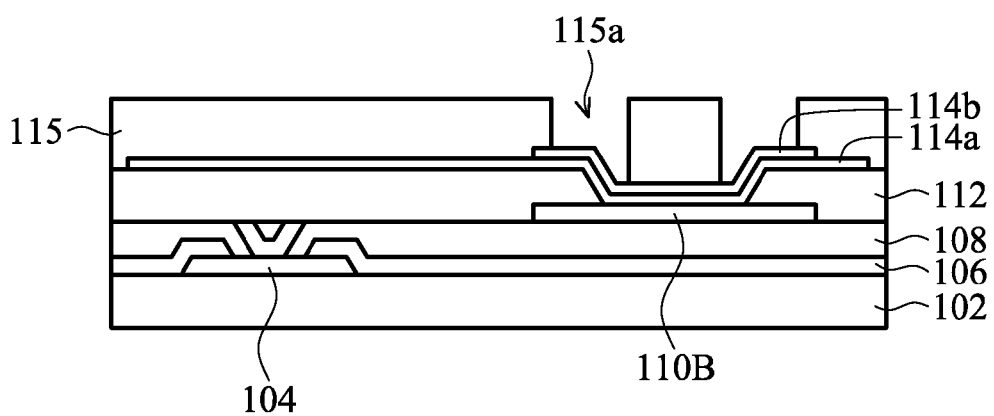

As shown in FIG. 6, a first UBM layer 114a is formed on the entire surface to cover the second protective layer 112 and the exposed portion of the landing pad region 110B so as to be electrically connected to the PPI layer 110. Then a second UBM layer 114b is formed and patterned on the first UBM layer 114a, resulting in a patterned UBM layer 114b over the landing pad region 110B, on which the crack stopper 116 will be formed. A photoresist layer 115 is then formed on the UBM layers 114a and 114b and patterned with an opening 115a to expose a portion of the second UBM layer 114b. The shape, dimension and location of the opening 115a are corresponding to those of the crack stopper 116, respectively. The UBM layers 114a and 114b are formed by using metal deposition methods. In some embodiments, the UBM layers 114a and 114b include at least one metallization layer comprising titanium (Ti), tantalum (Ta), titanium nitride (TiN), tantalum nitride (TaN), copper (Cu), copper alloys, nickel (Ni), tin (Sn), gold (Au), or combinations thereof. In one embodiment, the first UBM layer 114a includes at least one Ti-containing layer and the second UBM layer 114b includes at least one Cu-containing layer.

Figure 7:
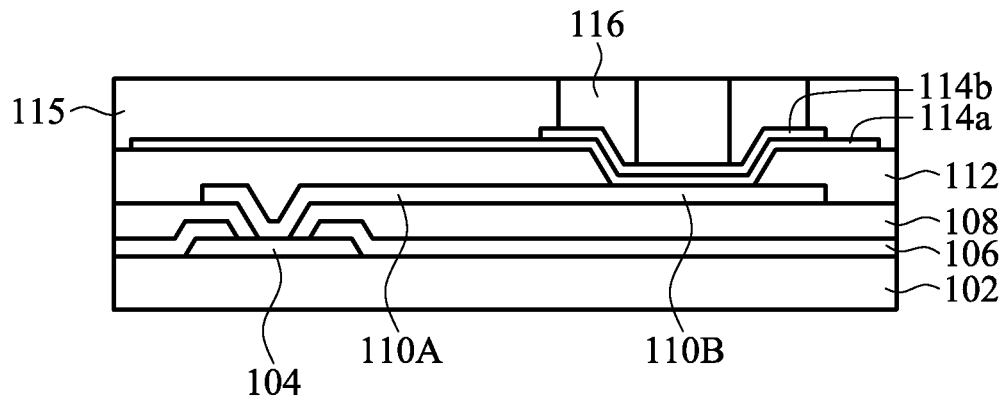
Figure 8:
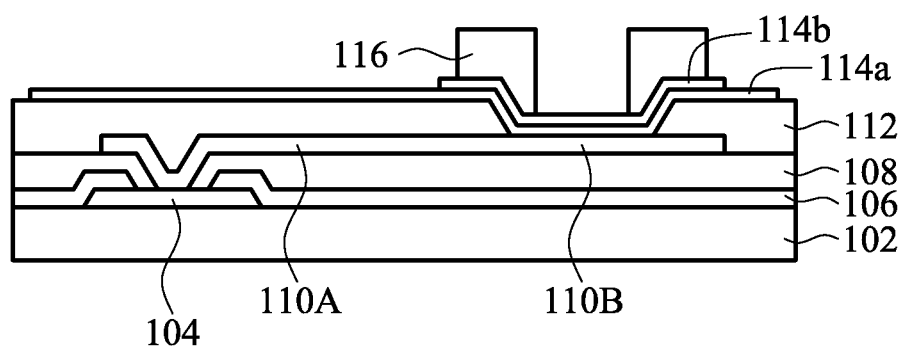

As shown in FIG. 7, a conductive material is formed to fill the opening 115a of the photoresist layer 115 and to be electrically connected to the UBM layer 114. After removing the photoresist layer 115, the conductive material layer left on the UBM layer 114b forms the crack stopper 116 as depicted in FIG. 8. In at least one embodiment, the crack stopper 116 includes a Cu layer. The Cu layer comprises pure elemental copper, copper containing unavoidable impurities, and/or copper alloys containing minor amounts of elements such as Ta, indium (In), SN, zinc (Zn), manganese (Mn), Cr, Ti, germanium (Ge), strontium (Sr), platinum (Pt), magnesium (Mg), aluminum (Al) or zirconium (Zr). The crack stopper 116 may be formed by sputtering, printing, electroplating, electro-less plating, electrochemical deposition (ECD), molecular beam epitaxy (MBE), atomic layer deposition (ALD), and/or commonly used CVD methods. In one embodiment, the Cu layer is formed by electrochemical plating (ECP).

Figure 9:
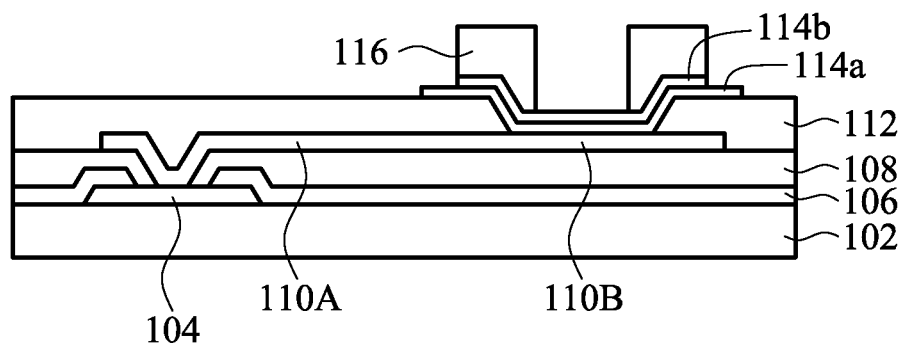

Then as shown in FIG. 9, the exposed surface of the first UBM layer 114a are etched, leaving the crack stopper 116 standing on the UBM layer 114. In some embodiments, the UBM etching process may use wet etching or dry etching process. The second UBM layer 114b may be etched during the UBM etching process, and therefore the periphery of the second UBM layer 114 b may be substantially aligned with the outside edge of the crack stopper 116.

Thereafter the bump 118 is formed on the UBM layer 114 to cover the crack stopper 116 as described and depicted in FIG. 1. The bump 118 can be a solder bump, a Cu bump or a metal bump including Ni or Au. In one embodiment, the bump 118 is a solder bump formed by attaching a solder ball on the UBM layer 114 and then thermally reflowing the solder material. In some embodiments, the solder bump may include a lead-free pre-solder layer, SnAg, or a solder material including alloys of tin, lead, silver, copper, nickel, bismuth, or combinations thereof. In some embodiments, the solder bump may be formed by plating a solder layer with photolithography technologies followed by reflowing processes.

After the bump formation, for example, an encapsulant may be formed, a singulation process may be performed to singulate individual dies 100, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

Figure 10:
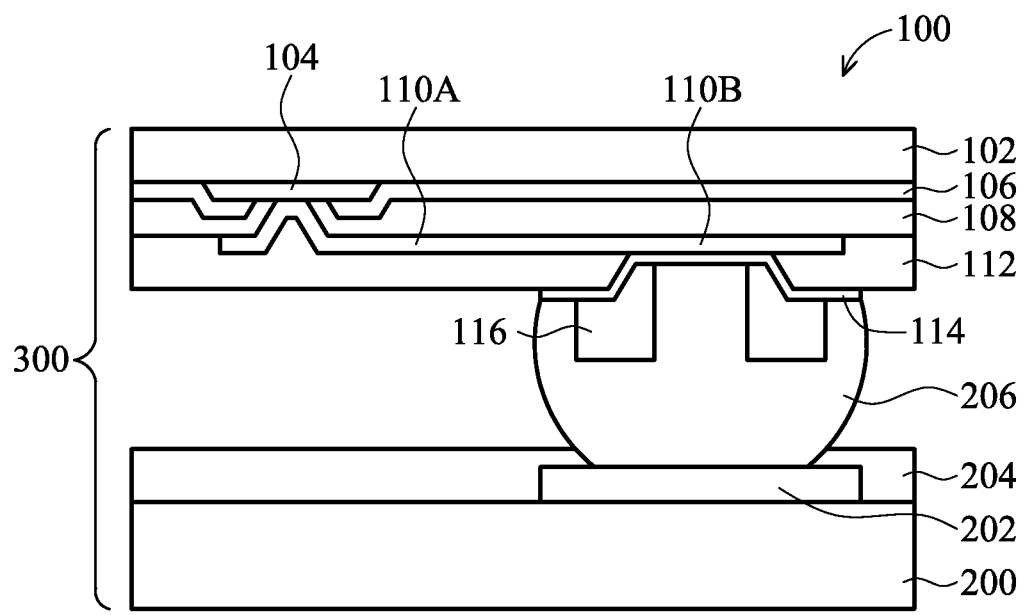
FIG. 10 is a cross-sectional view illustrating a semiconductor die with a crack stopper solder jointed to a substrate in accordance with an embodiment.

FIG. 10 is a cross-sectional diagram depicting an exemplary embodiment of a flip-chip assembly. The semiconductor die 100 shown in FIG. 1 is flipped upside down and attached to another substrate 200 at the bottom of FIG. 10. In some embodiments, the substrate 200 may be a package substrate, board (e.g., a printed circuit board (PCB)), a wafer, a die, an interposer substrate, or other suitable substrate. The bump structure is coupled to the substrate 200 through various conductive attachment points. For example, a conductive region 202 is formed and patterned on the substrate 200. The conductive region 202 is a contact pad or a portion of a conductive trace, which is presented and defined by a mask layer 204. In one embodiment, the mask layer 204 is a solder resist layer formed and patterned on the substrate 200 to expose the conductive region 202. The mask layer 204 has a mask opening, which provides a window for solder joint formation. For example, a solder layer including alloys of tin, lead, silver, copper, nickel, bismuth, or combinations thereof may be provided on the conductive region 202. In some embodiments, the semiconductor die 100 can be coupled to the substrate 200 to form a joint structure 206 between the landing pad region 110B and the conductive region 202. In an embodiment, the joint structure 206 is a solder joint structure. By providing the crack stopper 116 in the bump 118, the crack stopper 116 is also embedded in the solder joint structure 206 after the assembly process to provide a better joint scheme and void-less joint structure, thus achieving solder jointing quality and increasing thermal fatigue life in the packaging assembly. For example, a solder joint structure can be formed by a coupling process includes a flux application, chip placement, reflowing of melting solder joints, and/or cleaning of flux residue. The semiconductor die 100, the joint structure 206, and the substrate 200 may be referred to as a packaging assembly 300, or in the present embodiment, a flip-chip packaging assembly.

Figure 11:
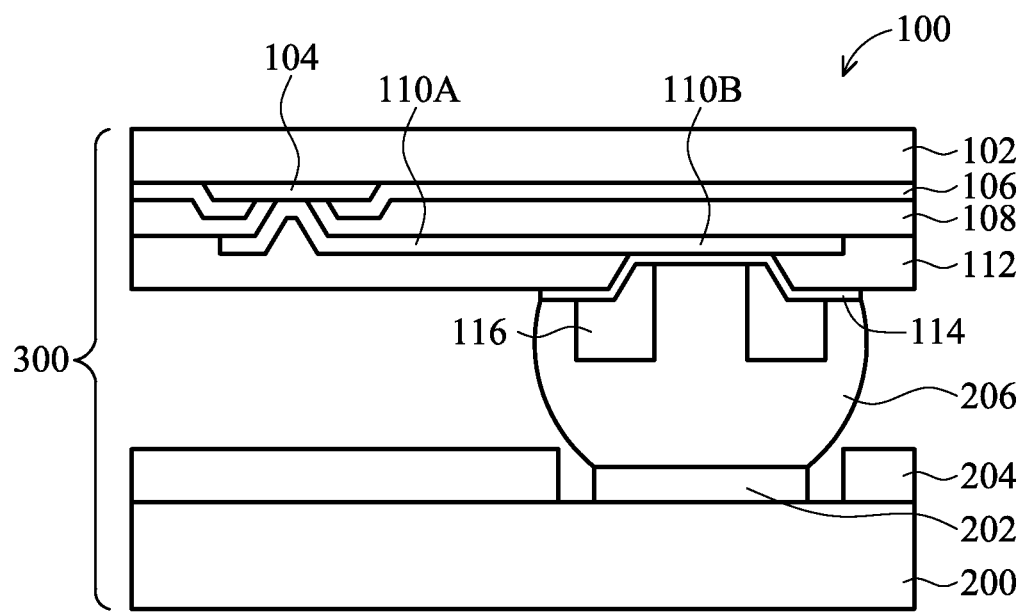
FIG. 11 is a cross-sectional view illustrating a semiconductor die with a crack stopper solder jointed to another substrate in accordance with an embodiment.

In alternative embodiments, the semiconductor die 100 can be flipped upside down and attached to another substrate 400 with non-solder mask defined technology as depicted in FIG. 11. The conductive region 202 is a contact pad or a portion of a conductive trace, which is not defined by a mask layer 204.

An aspect of this description is related to a semiconductor device. The semiconductor device comprises an under-bump metallization (UBM) layer over a substrate. The semiconductor device also comprises a copper-containing layer having a base portion over the UBM layer. The semiconductor device further comprises a solder bump over the UBM layer and over the copper-containing layer. The base portion is embedded in the solder bump. The copper-containing layer has a cylindrical shape and comprises at least two segments separated by at least two openings. A first total area (A) of the at least two openings is greater than about 3% of a second total area (B) of the at least two segments. The first total area (A) is less than about 70% of the second total area (B) of the at least two segments.

Another aspect of this description is related to an assembly. The assembly comprises a semiconductor die. The semiconductor die comprises a first substrate, an under-bump metallization (UBM) layer over the first substrate, and a cylindrical-shaped metal-containing layer over the UBM layer. The metal-containing layer is located along and within an outside periphery of the UBM layer. The assembly also comprises a second substrate. The assembly further comprises a solder joint structure coupling the semiconductor die to the second substrate. The metal-containing layer has at least two segments separated by at least two openings. A first total area (A) of the at least two openings and a second total area (B) of the at least two segments satisfy the following equation: $0.7*B>A>0.03*B$.

A further aspect of this description is related to a semiconductor device. The semiconductor device comprises an under-bump metallization (UBM) layer over a semiconductor substrate. The UBM layer comprises a first layer and a second layer. The semiconductor device also comprises a copper-containing layer having a base portion and at least two segments separated by at least two openings over the UBM layer. The copper-containing layer is located along an exterior region of the UBM layer, within an outside periphery of the first layer, and aligned with an outside periphery of the second layer. The semiconductor device further comprises a conductive material over the UBM layer and the copper-containing layer. The base portion is embedded in the conductive material. The copper-containing layer is a hollow cylinder. A first total area (A) of the at least two openings and a second total area (B) of the at least two segments satisfy the following equation: $0.7*B>A>0.03*B$.

Although the embodiments and their advantages have been described in detail, it should be understood that various changes, substitutions and alterations can be made herein without departing from the spirit and scope of the embodiments as defined by the appended claims. For example, the materials and methods of formation of the crack stoppers may be modified while remaining within the scope of the embodiments. Additionally, the precise shape of the crack stoppers may be adjusted in order to help prevent or reduce the propagation of cracks.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device, comprising:
an under-bump metallization (UBM) layer over a substrate;
a copper-containing layer having a base portion over the UBM layer; and
a solder bump over the UBM layer and over the copper-containing layer, the base portion being embedded in the solder bump;
wherein
the copper-containing layer has a cylindrical shape and comprises at least two segments separated by at least two openings,
a first total area (A) of the at least two openings is greater than about 3% of a second total area (B) of the at least two segments, and
the first total area (A) is less than about 70% of the second total area (B) of the at least two segments.

2. The semiconductor device of claim 1, wherein the copper-containing layer has a thickness (W), a height (H), and a H/W ratio greater than or equal to 1.0.

3. The semiconductor device of claim 2, wherein the H/W ratio is equal to or greater than 2.0.

4. The semiconductor device of claim 1, wherein the copper-containing layer comprises at least four segments separated by at least four openings.

5. The semiconductor device of claim 1, wherein a distance (d) between an outside edge of the copper-containing layer and the outside periphery of the UBM layer is greater than about 3.0 micrometers.

6. The semiconductor device of claim 5, wherein the distance (d) is greater than about ⅓ of a diameter (D) of the UBM layer.

7. The semiconductor device of claim 1, further comprising:
 an interconnect layer under the UBM layer; and
 a passivation layer under the interconnect layer.

8. The semiconductor device of claim 7, further comprising:
 a polymer layer, wherein a portion of the polymer layer is between the interconnect layer and the UBM layer.

9. An assembly, comprising:
 a semiconductor die, comprising:
  a first substrate;
  an under-bump metallization (UBM) layer over the first substrate; and
  a cylindrical-shaped metal-containing layer over the UBM layer, the metal-containing layer being located along and within an outside periphery of the UBM layer;
 a second substrate; and
 a solder joint structure coupling the semiconductor die to the second substrate, wherein
 the metal-containing layer has at least two segments separated by at least two openings, and
 a first total area (A) of the at least two openings and a second total area (B) of the at least two segments satisfy the following equation: $0.7*B > A > 0.03*B$.

10. The assembly of claim 9, wherein the metal-containing layer has a height (H), a width (W), and a H/W ratio of at least 1.0.

11. The assembly of claim 10, wherein the H/W ratio is equal to or greater than 2.0.

12. The assembly of claim 9, wherein the metal-containing layer has a height (H) greater than about 15.0 micrometers.

13. The assembly of claim 9, wherein a distance (d) between an outside edge of the metal-containing layer and the outside periphery of the UBM layer is greater than about 3.0 micrometers.

14. The assembly of claim 13, wherein a diameter (D) of the UBM layer and the distance (d) satisfy the equation: $⅓*D > d > 3.0$ micrometers.

15. The assembly of claim 9, wherein the metal-containing layer is in the solder joint structure.

16. The assembly of claim 9, wherein the semiconductor die further comprises:
 an interconnect layer under the UBM layer; and
 a passivation layer under the interconnect layer.

17. The assembly of claim 16, wherein the semiconductor die further comprises:
 a polymer layer, wherein a portion of the polymer layer is between the interconnect layer and the UBM layer, and a portion of the UBM layer is in contact with the interconnect layer.

18. A semiconductor device, comprising:
 an under-bump metallization (UBM) layer over a semiconductor substrate, the UBM layer comprising a first layer and a second layer;
 a copper-containing layer having a base portion and at least two segments separated by at least two openings over the UBM layer, the copper-containing layer being located along an exterior region of the UBM layer, within an outside periphery of the first layer, and aligned with an outside periphery of the second layer; and
 a conductive material over the UBM layer and the copper-containing layer, the base portion being embedded in the conductive material,
 wherein
  the copper-containing layer is a hollow cylinder, and
  a first total area (A) of the at least two openings and a second total area (B) of the at least two segments satisfy the following equation: $0.7*B > A > 0.03*B$.

19. The semiconductor device of claim 18, further comprising:
 an interconnect layer under the UBM layer; and
 a passivation layer under the interconnect layer.

20. The semiconductor device of claim 19, further comprising:
 a polymer layer over the interconnect layer.

* * * * *